US007323747B2

United States Patent
Ikuta et al.

(10) Patent No.: US 7,323,747 B2
(45) Date of Patent: Jan. 29, 2008

(54) LATERAL SEMICONDUCTOR DEVICE

(75) Inventors: Teruhisa Ikuta, Nara (JP); Hiroyoshi Ogura, Kyoto (JP); Yoshinobu Sato, Toyama (JP); Toru Terashita, Toyama (JP)

(73) Assignee: Matsushita Electric Industrial, Co., Ltd., Osaka (JP)

( * ) Notice: Subject to any disclaimer, the term of this patent is extended or adjusted under 35 U.S.C. 154(b) by 0 days.

(21) Appl. No.: 11/488,154

(22) Filed: Jul. 18, 2006

(65) Prior Publication Data

US 2007/0075393 A1 Apr. 5, 2007

(30) Foreign Application Priority Data

Sep. 30, 2005 (JP) .............................. 2005-285726

(51) Int. Cl.
*H01L 29/49* (2006.01)
(52) U.S. Cl. ...................... 257/343; 257/288; 257/347; 257/E29.152
(58) Field of Classification Search ................ 257/343, 257/347, 288, E29.152
See application file for complete search history.

(56) References Cited

U.S. PATENT DOCUMENTS

| 5,258,636 | A | * | 11/1993 | Rumennik et al. | .......... 257/339 |
| 5,723,895 | A | * | 3/1998 | Takahashi | .................. 257/499 |
| 6,441,432 | B1 | * | 8/2002 | Sumida | ...................... 257/339 |
| 6,724,041 | B2 | * | 4/2004 | Rumennik et al. | .......... 257/336 |
| 6,982,461 | B2 | * | 1/2006 | Hossain et al. | ............. 257/341 |
| 7,002,211 | B2 | * | 2/2006 | Onishi et al. | ............... 257/342 |
| 2002/0050619 | A1 | * | 5/2002 | Kawaguchi et al. | ........ 257/368 |

FOREIGN PATENT DOCUMENTS

JP 2000-156495 6/2000

* cited by examiner

*Primary Examiner*—Evan Pert
*Assistant Examiner*—Victor A. Mandala, Jr.
(74) *Attorney, Agent, or Firm*—Steptoe & Johnson LLP

(57) ABSTRACT

In a high voltage P-channel MOS transistor formed on a silicon-on-insulator (SOI) substrate, a $P^+$-type source region (8), an N-type body region (4) and an $N^+$-body contact diffusion region (10) are surrounded by a $P^+$-type drain region (9) and a P-type drift region (5). A gate electrode (7) is formed to overlap the end portion of the N-type body region (4). The end portion of the N-type body region (4) has a portion in which the gate electrode (7) and the $P^+$-type source region (8) are not adjacent to each other.

3 Claims, 7 Drawing Sheets

--- 2nd CONVENTIONAL EXAMPLE
—— 1st CONVENTIONAL EXAMPLE

LATERAL SEMICONDUCTOR DEVICE

FIELD OF THE INVENTION

The present invention relates to a high voltage lateral semiconductor formed on a silicon-on-insulator (SOI) substrate.

BACKGROUND OF THE INVENTION

Recently, for driving a color plasma display panel (PDP) high voltage integrated circuits in which high voltage N-channel/P-channel MOS transistors are formed on a SOI substrate are frequently used.

The high voltage N-channel/P-channel transistor preferably has a high breakdown voltage in both on and off states. Now, two conventional examples of the high voltage P-channel MOS transistor will be described.

FIG. 3 shows a cross sectional view of the high voltage P-channel MOS transistor.

A semiconductor layer 3 is formed on a support substrate 1 through a buried oxide film 2. On the surface of the semiconductor layer 3, an N-type body region 4 and a $P^+$-type drain region 9 are formed. On the surface of the N-type body region 4, a $P^+$-type source region 8 and an $N^+$-type diffused region 10 are formed. And a gate electrode 7 is formed on the edge of the N-type body region 4 via a gate oxide film 6.

In an off state, when a reverse bias is applied between the $P^+$-type source region 8 and the $P^+$-type drain region 9, a depletion region expands in a PN junction between the N-type body region 4 and a P-type drift region 5. The gate electrode 7 serves as a field plate, and an electric field increases in the surface of the P-type drift region 5 located below the end portion of the field plate 7. In order to improve an off-state breakdown voltage, the electric field must decrease.

Meanwhile, in an on-state, when the amount of drain current in the drift region 5 increases, a potential distribution is shifted toward the drain region by the Kirk effect. Therefore, the electric field increases in the edge of the $P^+$-type drain region 9. When the diffusion depth of the $P^+$-type drain region 9 is small, the electric field is concentrated to the $P^+$-type drain region 9 and thus the breakdown voltage is reduced. In order to improve the breakdown voltage, an intermediate diffusion-layer (not shown) with a relatively high diffusion depth, is often inserted.

Next, the planar layout of the high voltage P-channel MOS transistor will be described.

In general, as a planar layout for improving the on-state voltage, there are known two conventional examples.

A first conventional example has a plane structure in which the $P^+$-type drain region 9 is wholly surrounded by the N-type body region 4, as shown in FIG. 4. A portion of the $P^+$-type source region is not formed on the surface of the annular N-type body region 4 surrounding the $P^+$-type drain region 9. With this structure, a current density may be reduced in the edge of the drain region. So, it is possible to improve the on-state breakdown voltage.

A second conventional example has a plane structure in which the N-type body region 4 is wholly surrounded by the $P^+$-type drain region 9 and the P-type drift region 5, as shown in FIG. 5. Since the circumferential length of the $P^+$-type drain region 9 is large, the current density is reduced in the edge of the drain. Thereby the electric field can be suppressed, improving the on-state breakdown voltage.

FIG. 6 shows a relationship between drain voltage and drain current of the two conventional structures. In the first conventional example, the on-state breakdown voltage is a little more than 100 volts, whereas, in the second conventional example, the on-state breakdown voltage is a little less than 200 volts. The second conventional example has the layout in which the source body region is wholly surrounded by the drain region. Thus, it is possible to improve the on-state breakdown voltage.

However, the high voltage MOS transistor of the second conventional example has two problems as follows.

First, as shown in FIG. 6, a negative resistance region is observed in the drain voltage-current characteristics. It can be seen that the drain current decreases at the drain voltage more than 140 volts. Since the region due to heat generation is an unstable phenomenon that depends on an applied condition or thermal resistance, and thus must be reduced.

Second, an off-state breakdown voltage is slightly reduced compared with the high voltage MOS transistor of the first conventional example. In the high voltage MOS transistor of the second conventional example, the source body region is surrounded by the drain region in the end portion of the device. To this end, the curvature radius of the depletion region which extends from the body region to the drift region is smaller than that of the high voltage MOS transistor of the first conventional example and thus the electric field increases.

Accordingly, in the high voltage MOS transistor of the second conventional example, when the curvature radius of the end portion of the body region increases, the off-state breakdown voltage increases. However, the area of the device increases, which in turn increases the cost thereof.

SUMMARY OF THE INVENTION

The present invention provides a structure of a high voltage MOS transistor capable of solving the two problems, specifically a lateral semiconductor device having a planar layout.

According to an aspect of the present invention, there is provided a lateral semiconductor device formed on a semiconductor layer connected to a support substrate through a buried insulating film. The lateral semiconductor includes a body region of a first conductive type formed on the semiconductor layer, and a drift region of a second conductive type wholly surrounding the body region, which drift region is adjacent to or separated from the body region. The lateral semiconductor further includes a drain region of a second conductive type that is separated from the body region and is in contact with the drift region, a source region of a second conductive type that is formed in the body region and separated from an end portion of the body region, an insulating film formed on the semiconductor layer and covering at least a range from an end portion of the source region to an end portion of the drain region, a gate electrode covering a range from an upper side of the end portion of the source region to an upper side of the drift region through the insulating film, and electrodes formed in the source region, the body region and the drain region. Here, the body region has a planar shape formed by at least a central portion having a straight shape and end portions each having a semicircular shape. Further, the gate electrode and the source region are not adjacent to each other through the insulating film in the end portions. In this configuration, it is preferable that each of the end portions of the body region has a diameter larger than a width of the central portion.

According to another aspect of the present invention, there is provided a lateral semiconductor device formed on a semiconductor layer connected to a support substrate through a buried insulating film. The lateral semiconductor device includes a body region of a first conductive type formed on the semiconductor layer, and a drift region of a second conductive type wholly surrounding the body region, which drift region is adjacent to or separated from the body region. The lateral semiconductor device further includes a drain region of a second conductive type that is separated from the body region and is in contact with the drift region, a source region of a second conductive type that is formed in the body region and separated from an end portion of the body region, an insulating film formed on the semiconductor layer and covering at least a range from an end portion of the source region to an end portion of the drain region, a gate electrode covering a range from an upper side of the end portion of the source region to an upper side of the drift region through the insulating film, and electrodes formed in the source region, the body region and the drain region. Here, the body region has a planar shape formed by at least a central portion having a straight shape and end portions each having a semicircular shape. Further, each of the end portions of the body region has a diameter larger than a width of the central portion.

According to the present invention, the high voltage MOS transistor having a planar layout in which the source body region is wholly surrounded by the drain region has the following effects.

Since the gate electrode and the source region are not adjacent to each other through the insulating film in the end portion of the body region, a MOS transistor operation is not performed and current through the end portion of the body region can be reduced. Accordingly, it is possible to suppress heat in the end portion of the body region. In addition, since an on-state breakdown voltage is high and influence due to heat generation is reduced. Therefore, it is possible to obtain stable drain voltage-current characteristics.

In addition, since the diameter of the end portion of the body region is larger than the width of the straight portion, it is possible to reduce electric field concentration due to curvature of the end portion of the body region, and to increase an off-state breakdown voltage.

DESCRIPTION OF THE EMBODIMENTS

Hereinafter, embodiments of the present invention will be described with reference to the attached drawings.

First Embodiment

Figure 1:
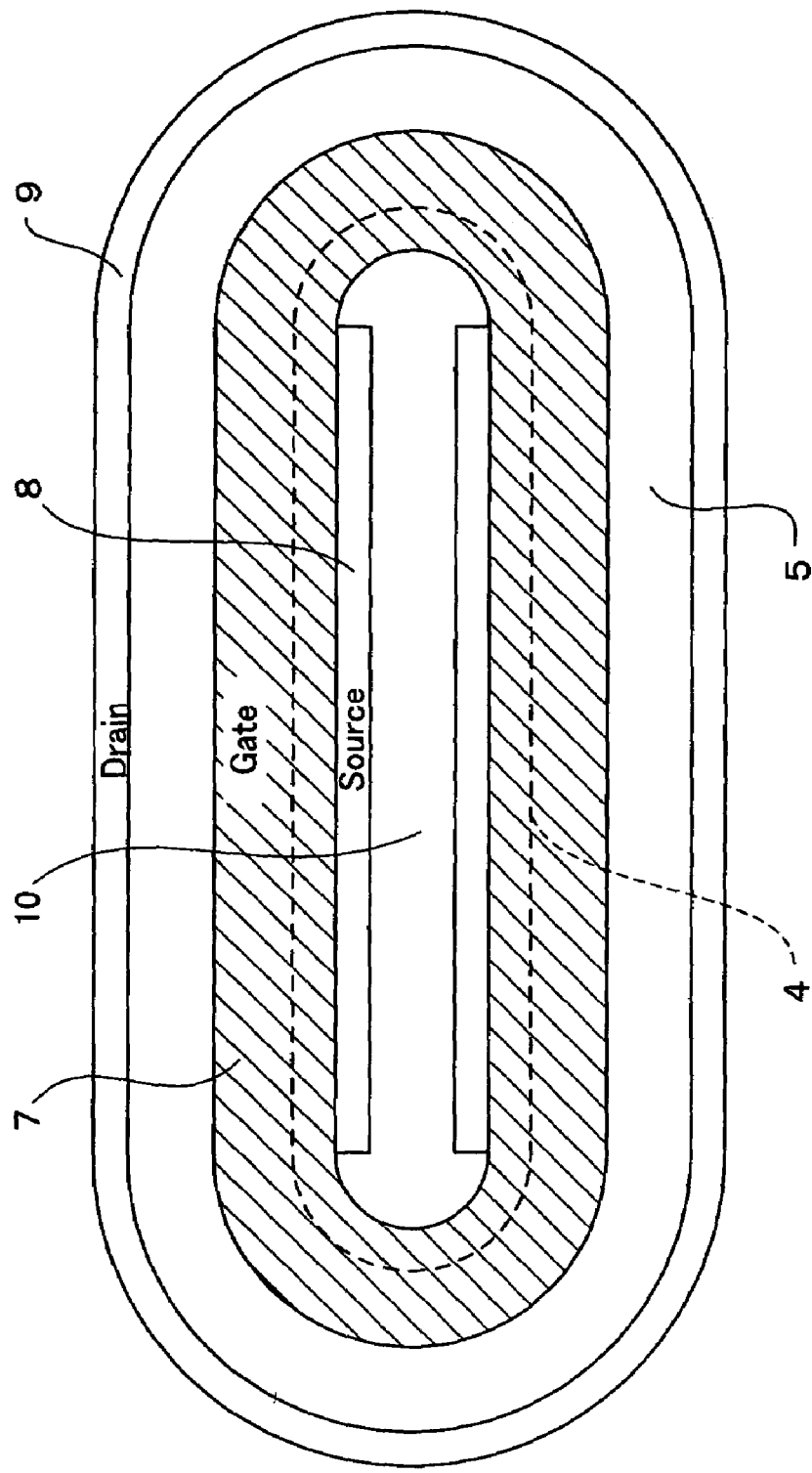
FIG. 1 is a plan view of a high voltage P-channel MOS transistor according to a first embodiment of the present invention.

FIG. 1 shows a high voltage P-channel MOS transistor according to a first embodiment of the present invention.

As shown in FIG. 1, a $P^+$-type source region 8, an N-type body region 4 and an $N^+$-body contact diffusion region 10 are surrounded by a $P^+$-type drain region 9 and a P-type drift region 5. A gate electrode 7 is formed to overlap the end portion of the N-type body region 4. The end portion of the N-type body region 4 having a semicircular planar shape has a portion in which the gate electrode 7 and the $P^+$-type source region 8 are not adjacent to each other.

Accordingly, although a bias is applied between the gate and the source, a MOS transistor operation is not performed in the end portion of the N-type body region 4 and thus drain current cannot flow through the end portion. Since the current does not flow through the end portion of the N-type body region 4, the total amount of the drain current decreases but the heat can be prevented from generating in the end portion of the N-type body region 4 to obtain stable drain voltage-current characteristics.

Figure 7:
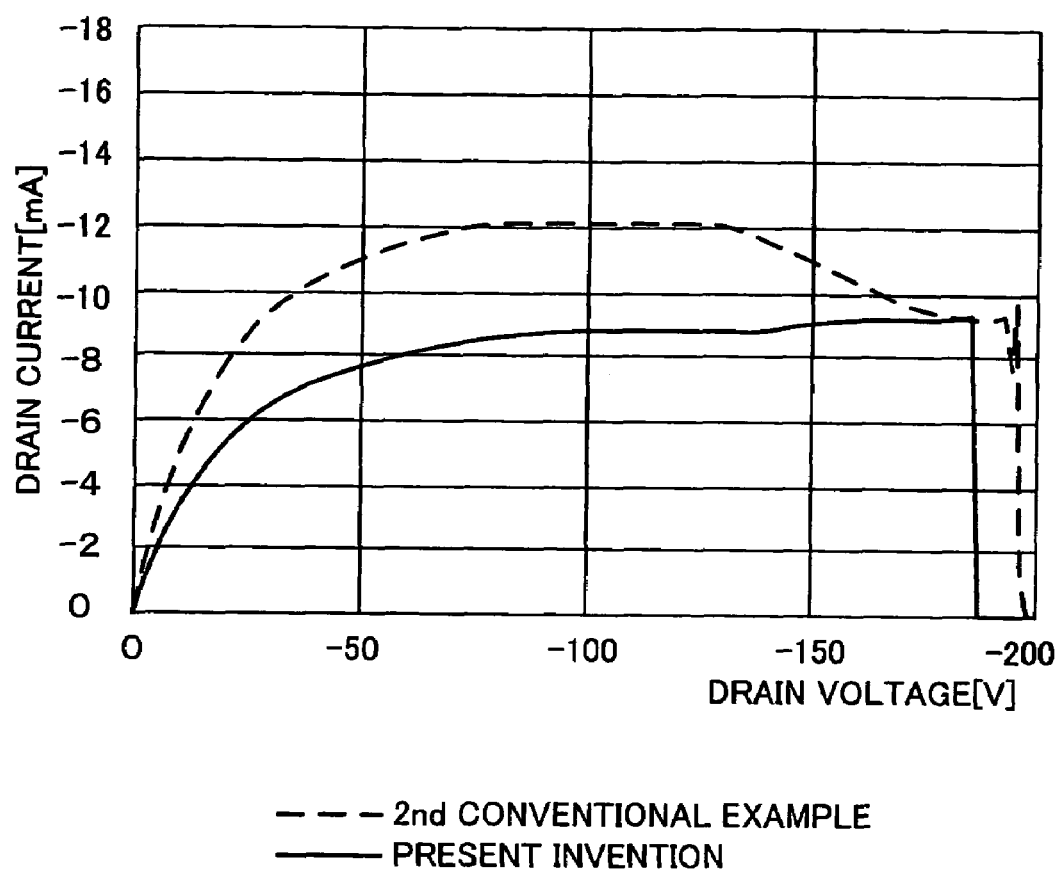
FIG. 7 is a drain voltage-current characteristic diagram of the high voltage P-channel MOS transistor according to the present invention.

FIG. 7 shows an actual measurement value of the drain voltage-current characteristics (DC). According to the first embodiment, a negative resistance region does not occur at the drain voltage more than 140 volts and good current-voltage characteristics are obtained, in comparison with the conventional structures.

Second Embodiment

Figure 2:
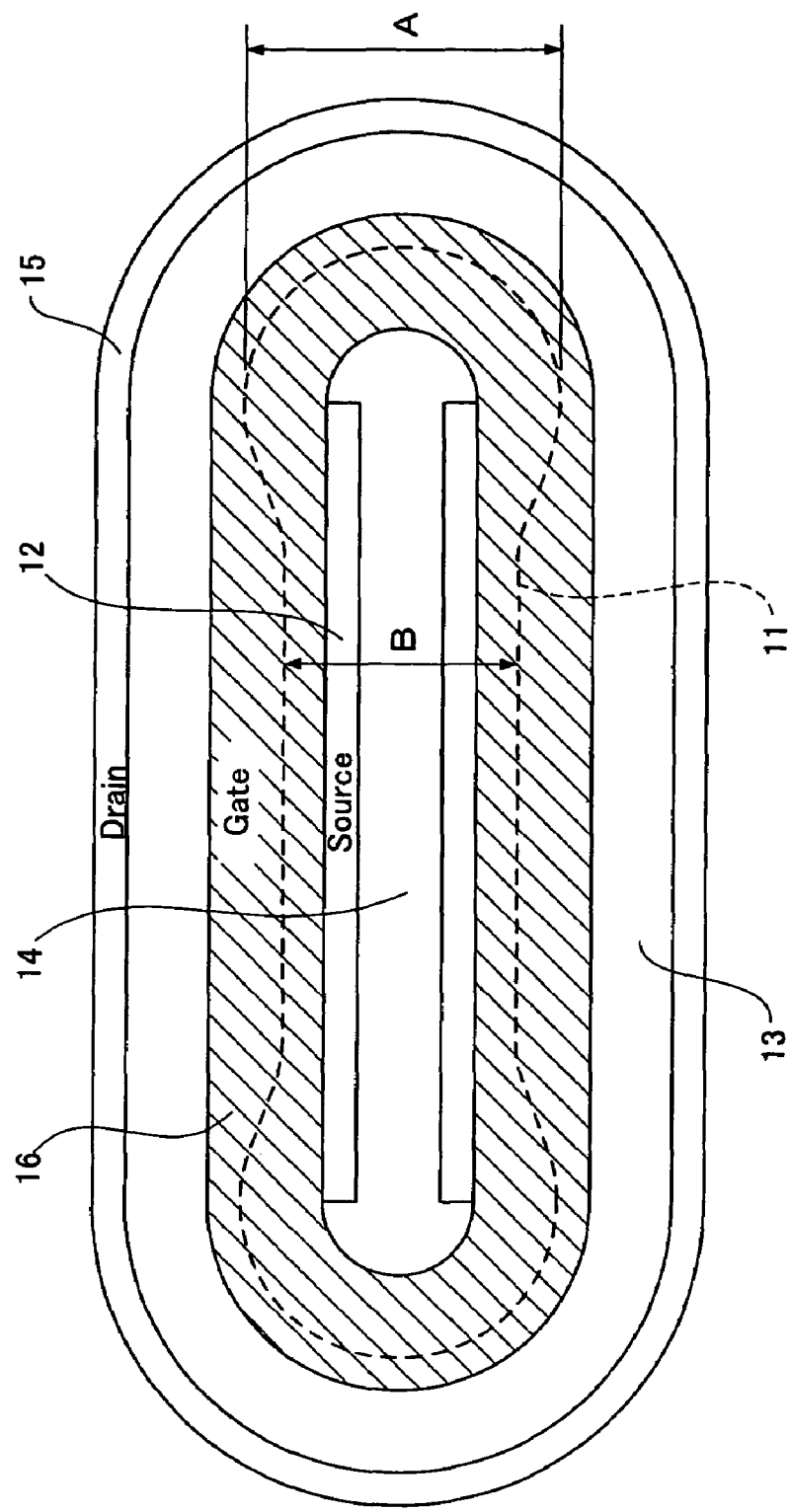
FIG. 2 is a plan view of a high voltage N-channel MOS transistor according to a second embodiment of the present invention.
Figure 3:
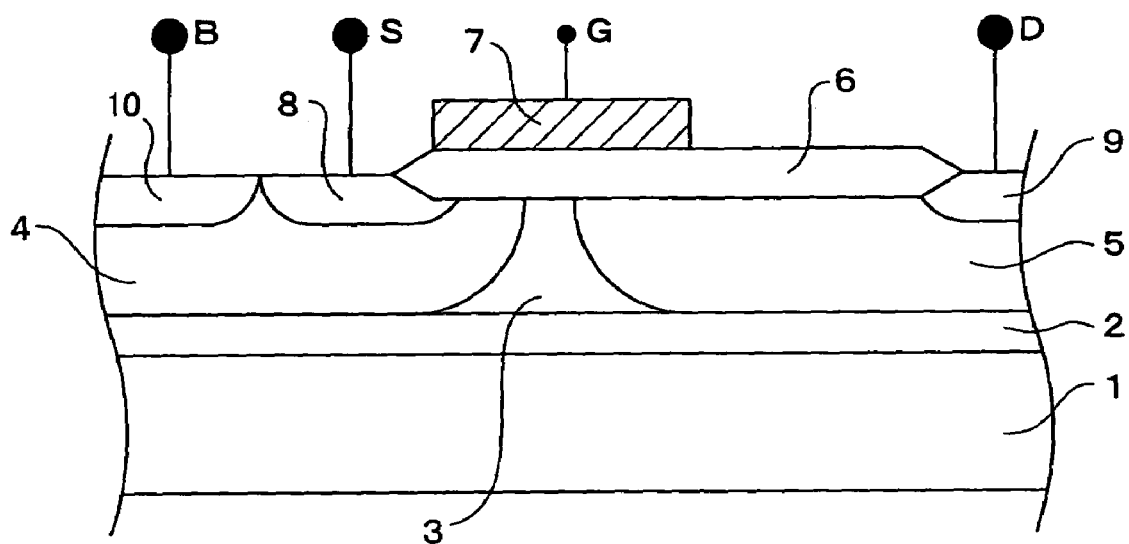
FIG. 3 is a cross-sectional view of a conventional high voltage P-channel MOS transistor.
Figure 4:
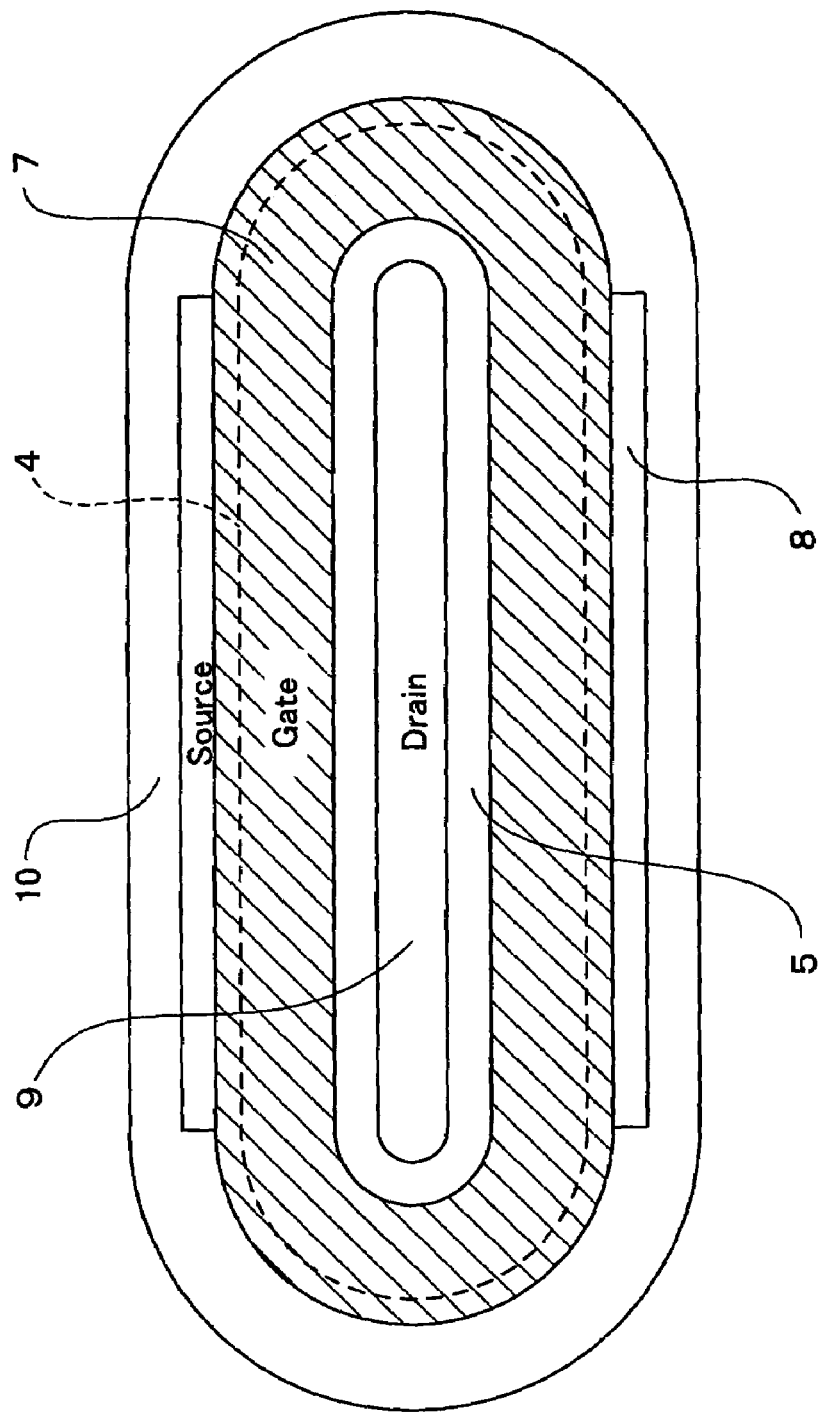
FIG. 4 is a plan view of a high voltage P-channel MOS transistor of a first conventional example.
Figure 5:
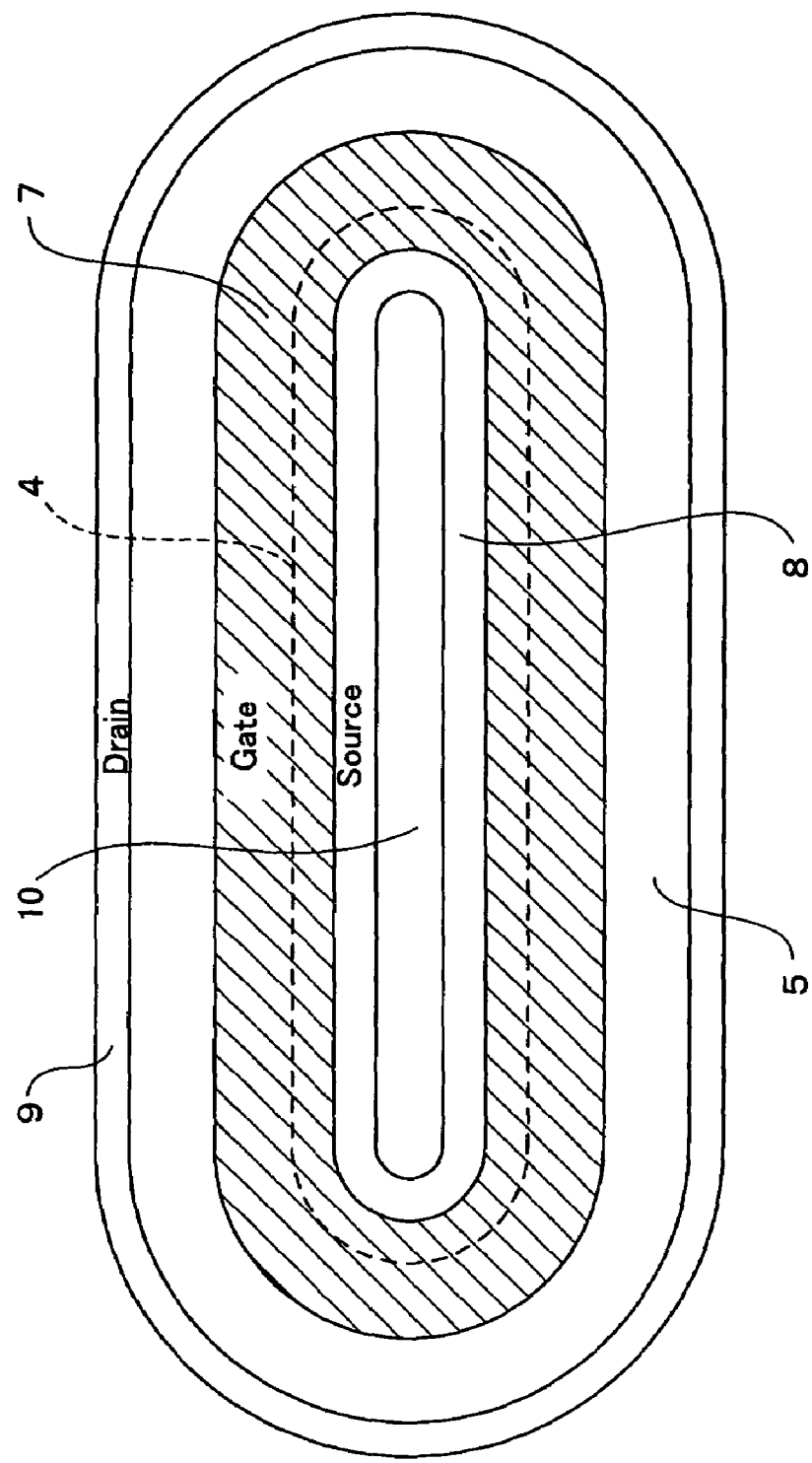
FIG. 5 is a plan view of a high voltage P-channel MOS transistor of a second conventional example.
Figure 6:
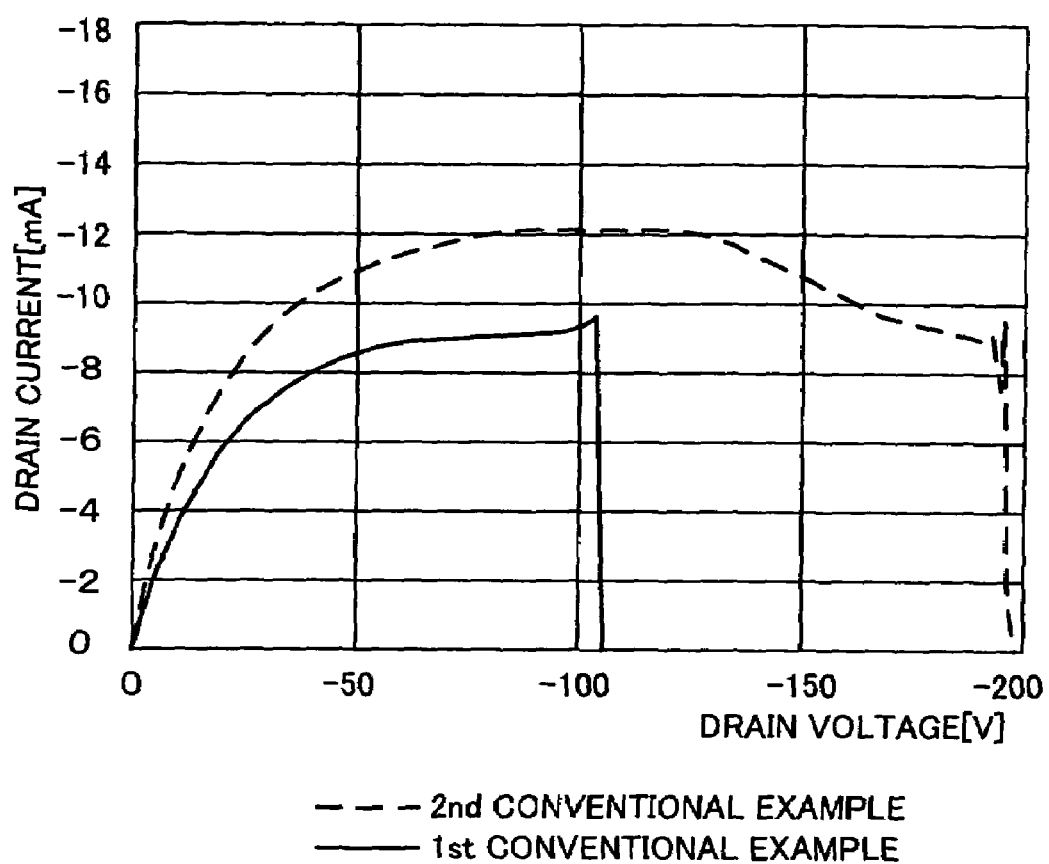
FIG. 6 is a drain voltage-current characteristic diagram of the conventional high voltage P-channel MOS transistor.

FIG. 2 shows a high voltage N-channel MOS transistor according to a second embodiment of the present invention.

As shown in FIG. 2, an $N^+$-type source region 12, a P-type body region 11 and a $P^+$-body contact diffusion region 14 are surrounded by a $N^+$-type drain region 15 and an N-type drift region 13, similar to the first embodiment. A gate electrode 16 is formed to overlap the end portion of the P-type body region 11. The end portion of the P-type body region 11 has a semicircular planar shape and the diameter A thereof is in a range of 14 to 18 μm. The width B of the straight central portion of the P-type body region 11 is 10 μm. When the diameter of the end portion of the body region is the same as the width of the straight portion thereof, the off-state breakdown voltage is 175 volts, whereas, when the diameter of the end portion of the body region is larger than the width of the central portion thereof, the off-state breakdown voltage increases up to 180 volts.

This is because the diameter of the end portion of the P-type body region 11 enhances to increase the curvature radius of a depletion region which extends in the N-type drift region 13, such that the electric field in a portion located below the end portion of the gate electrode 16 decreases. Since the diameter of the end portion of the P-type body region 11 increases and the width of the central portion thereof is not changed, the area of the device does not increase and the cost thereof does not increase.

As described above, according to the present invention, since the high voltage MOS transistor has the planar layout in which the source body region is wholly surrounded by the drain region, it is possible to obtain stable on/off-state breakdown voltage characteristics without increasing the area of the device.

In addition, in the first embodiment, the portion in which the gate electrode and the source region are not adjacent to each other may extend from the end portion toward the central portion.

Although a diffused layer having the same conductive type as that of the source region is formed adjacent to the end portion of the body region, the diffused layer does not serve as the source region when the diffused layer is not electrically connected to the source region located at the central portion. Accordingly, a structure having the diffusion layer is also included in the device structure according to the present invention.

Although, in the embodiments of the present invention, the examples of the high voltage MOS transistor are described, the present invention is applicable to an insulated gate bipolar transistor (IGBT).

Although, in the embodiments of the present invention, a method of manufacturing the high voltage MOS transistor is not specially described, the high voltage MOS transistor can be manufactured using a method disclosed in Japanese Patent No. 3473460, for example.

As described above, the present invention is advantageously applicable to a high voltage lateral semiconductor device formed on the SOI substrate.

What is claimed is:

1. A lateral semiconductor device formed on a semiconductor layer connected to a support substrate through a buried insulating film, comprising:
    a body region of a first conductive type formed on the semiconductor layer;
    a drift region of a second conductive type wholly surrounding the body region, the drift region being adjacent to or separated from the body region;
    a drain region of a second conductive type that is separated from the body region and is in contact with the drift region;
    a source region of a second conductive type that is formed in the body region and separated from an end portion of the body region;
    an insulating film formed on the semiconductor layer and covering at least a range from an end portion of the source region to an end portion of the drain region;
    a gate electrode covering a range from an upper side of the end portion of the source region to an upper side of the drift region through the insulating film; and
    electrodes formed on the source region, the body region and the drain region, wherein
    the body region has a planar shape formed by at least a central portion having a straight shape and end portions each having a substantially semicircular shape, and the gate electrode and the source region are not adjacent to each other through the insulating film in the end portions.

2. The lateral semiconductor device according to claim 1, wherein each of the end portions of the body region has a diameter larger than a width of the straight portion.

3. A lateral semiconductor device formed on a semiconductor layer connected to a support substrate through a buried insulating film, comprising:
    a body region of a first conductive type formed on the semiconductor layer;
    a drift region of a second conductive type wholly surrounding the body region, the drift region being adjacent to or separated from the body region;
    a drain region of a second conductive type that is separated from the body region and is in contact with the drift region;
    a source region of a second conductive type that is formed in the body region and separated from an end portion of the body region;
    an insulating film formed on the semiconductor layer and covering at least a range from an end portion of the source region to an end portion of the drain region;
    a gate electrode covering a range from an upper side of the end portion of the source region to an upper side of the drift region through the insulating film; and
    electrodes formed on the source region, the body region and the drain region, wherein
    the body region has a planar shape formed by at least a central portion having a straight shape and end portions each having a straight shape and end portions each having a substantially semicircular shape, and each of the end portions of the body region has a diameter larger than a width of the straight portion.

* * * * *